US012593622B2

(12) United States Patent
Ma et al.

(10) Patent No.: US 12,593,622 B2
(45) Date of Patent: Mar. 31, 2026

(54) PHASE CHANGE MEMORY, ELECTRONIC DEVICE, AND PREPARATION METHOD FOR PHASE CHANGE MEMORY

(71) Applicant: HUAWEI TECHNOLOGIES CO., LTD., Shenzhen (CN)

(72) Inventors: Ping Ma, Hangzhou (CN); Xiang Li, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 192 days.

(21) Appl. No.: 18/539,657

(22) Filed: Dec. 14, 2023

(65) Prior Publication Data

US 2024/0130253 A1 Apr. 18, 2024

Related U.S. Application Data

(63) Continuation of application No. PCT/CN2022/088232, filed on Apr. 21, 2022.

(30) Foreign Application Priority Data

Jun. 16, 2021 (CN) .......................... 202110663808.8

(51) Int. Cl.
*H10N 70/00* (2023.01)
*G11C 13/00* (2006.01)
(Continued)

(52) U.S. Cl.
CPC ....... *H10N 70/231* (2023.02); *G11C 13/0004* (2013.01); *H10B 63/10* (2023.02);
(Continued)

(58) Field of Classification Search
CPC .. H10N 70/231; H10N 70/063; H10N 70/826; H10N 70/828; H10N 70/8828;
(Continued)

(56) References Cited

U.S. PATENT DOCUMENTS

| | | |
|---|---|---|
| 2006/0226409 A1 | 10/2006 | Burr et al. |
| 2007/0008774 A1 | 1/2007 | Khang |

(Continued)

FOREIGN PATENT DOCUMENTS

| | | |
|---|---|---|
| CN | 1815363 A | 8/2006 |
| CN | 1971964 A | 5/2007 |

(Continued)

OTHER PUBLICATIONS

Extended European Search Report in European Appln No. 22823900.0, dated Sep. 9, 2024, 9 pages.

(Continued)

*Primary Examiner* — Thong Q Le
(74) *Attorney, Agent, or Firm* — Fish & Richardson P.C.

(57) ABSTRACT

An example phase change memory, as well as an electronic device comprising an example phase change memory, include a plurality of phase change memory cells. Each of the plurality of phase change memory cells includes a first electrode, a phase change body, and a second electrode, which are sequentially arranged in a first direction. The phase change body has a first end face facing the first electrode and a second end face facing the second electrode. The phase change body further includes a convergence portion, and the convergence portion is located between the first end face and the second end face, where a sectional area of the convergence portion in a direction perpendicular to (Continued)

the first direction is relatively smaller than an area of the first end face and an area of the second end face. A preparation method for a phase change memory is also provided.

20 Claims, 14 Drawing Sheets

(51) Int. Cl.
 *H10B 63/10* (2023.01)
 *H10N 70/20* (2023.01)
(52) U.S. Cl.
 CPC ......... *H10N 70/063* (2023.02); *H10N 70/826* (2023.02); *H10N 70/841* (2023.02)
(58) Field of Classification Search
 CPC .. H10N 70/061; H10N 70/841; H10N 70/026; H10N 70/043; H10N 70/861; H10N 70/00; H10N 70/066; H10N 70/821; H10N 70/8413; H10N 70/884; G11C 13/0004; C10B 63/10
 USPC .................................................. 365/158, 163
 See application file for complete search history.

(56) References Cited

U.S. PATENT DOCUMENTS

| | | | |
|---|---|---|---|
| 2007/0096248 A1 | 5/2007 | Philipp et al. | |
| 2008/0023685 A1 | 1/2008 | Czubatyj et al. | |
| 2009/0221146 A1* | 9/2009 | Seko .................... | H10N 70/063 |
| | | | 438/720 |
| 2009/0231911 A1 | 9/2009 | Liu et al. | |

FOREIGN PATENT DOCUMENTS

| | | |
|---|---|---|
| CN | 101110467 A | 1/2008 |
| KR | 20210027306 A | 3/2021 |
| TW | 200824112 A | 6/2008 |

OTHER PUBLICATIONS

International Search Report and Written Opinion in International Appln. No. PCT/CN2022/088232, mailed on May 27, 2022, 18 pages (with English translation).
EP Communication Pursuant to Article 94(3) EPC in European Appln. No. 22823900.0, mailed on Jul. 15, 2025, 6 pages.

* cited by examiner

10

10

First
direction

S100 — Prepare a phase change layer on an upper surface of a first electrode

S200 — Etch the phase change layer to form a phase change body

S300 — Prepare an insulator on the upper surface of the first electrode

S400 — Prepare a second electrode on an upper surface of the phase change body

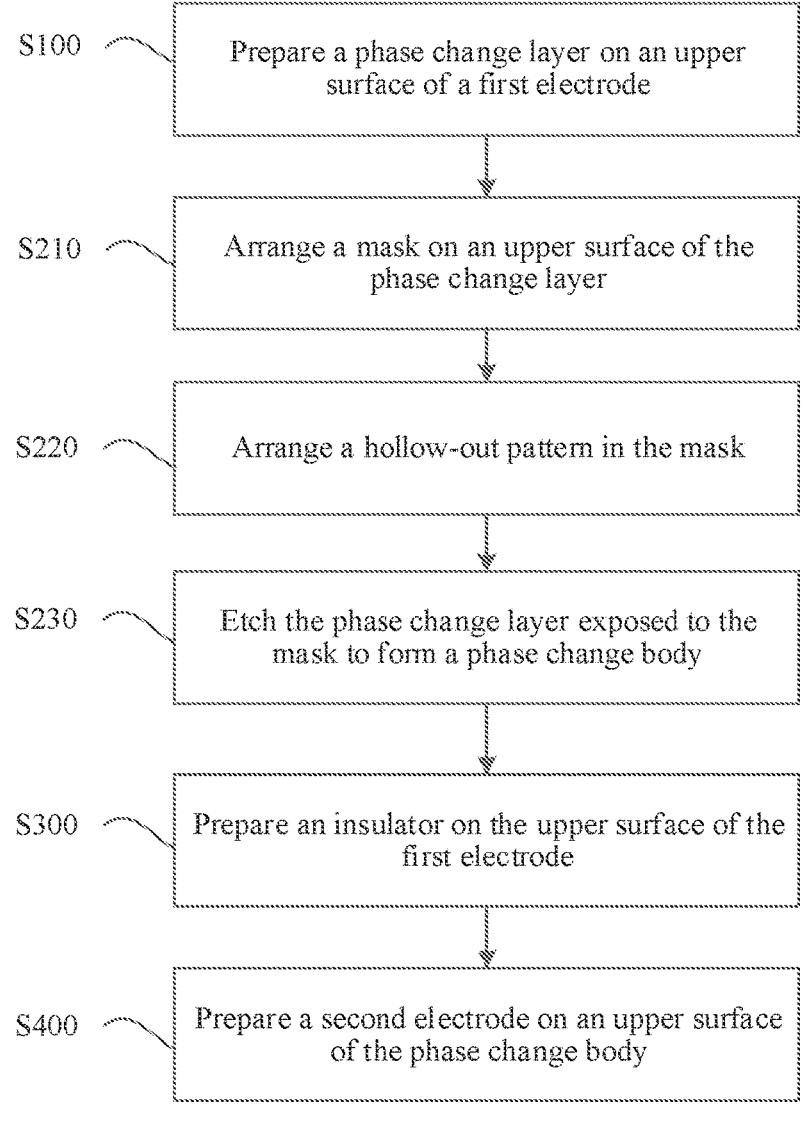

S100 — Prepare a phase change layer on an upper surface of a first electrode

S210 — Arrange a mask on an upper surface of the phase change layer

S220 — Arrange a hollow-out pattern in the mask

S230 — Etch the phase change layer exposed to the mask to form a phase change body S300 — Prepare an insulator on the upper surface of the first electrode S400 — Prepare a second electrode on an upper surface of the phase change body

FIG. 14

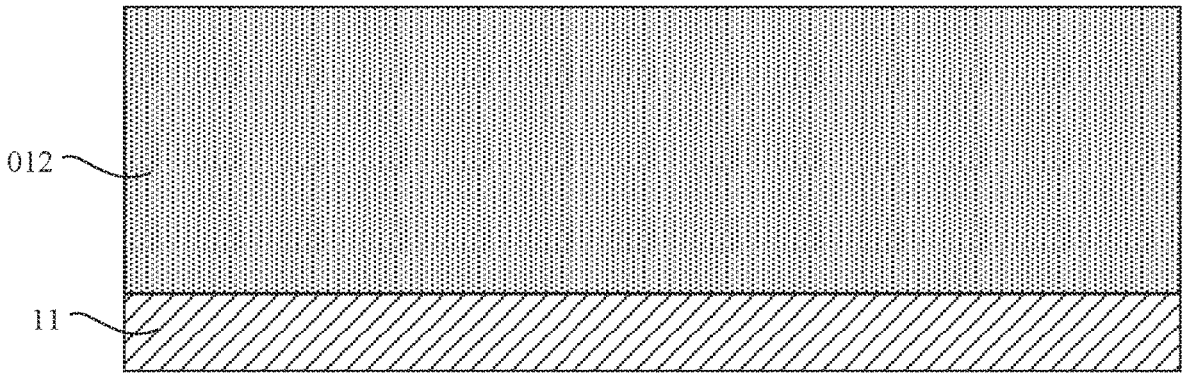

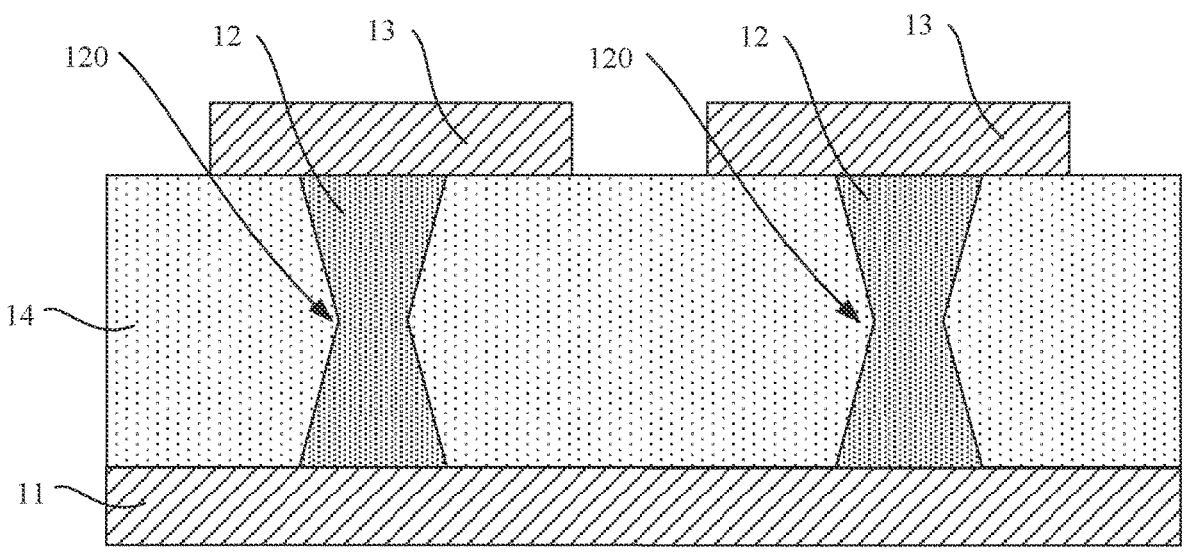

FIG. 19

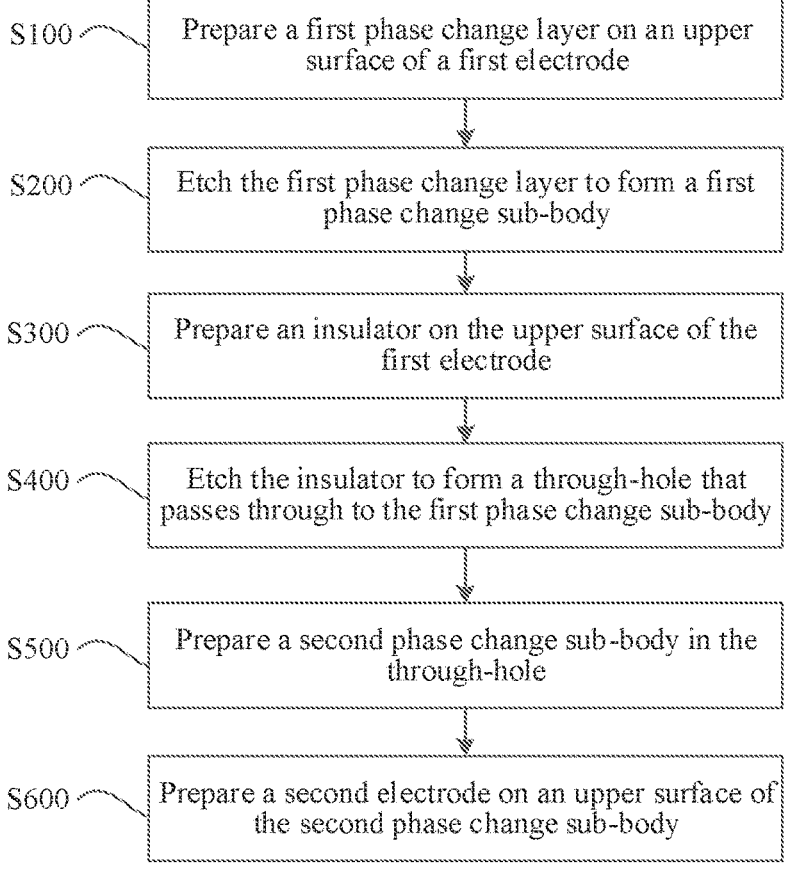

| | |
|---|---|
| S100 | Prepare a first phase change layer on an upper surface of a first electrode |
| S200 | Etch the first phase change layer to form a first phase change sub-body |
| S300 | Prepare an insulator on the upper surface of the first electrode |
| S400 | Etch the insulator to form a through-hole that passes through to the first phase change sub-body |
| S500 | Prepare a second phase change sub-body in the through-hole |
| S600 | Prepare a second electrode on an upper surface of the second phase change sub-body |

FIG. 20

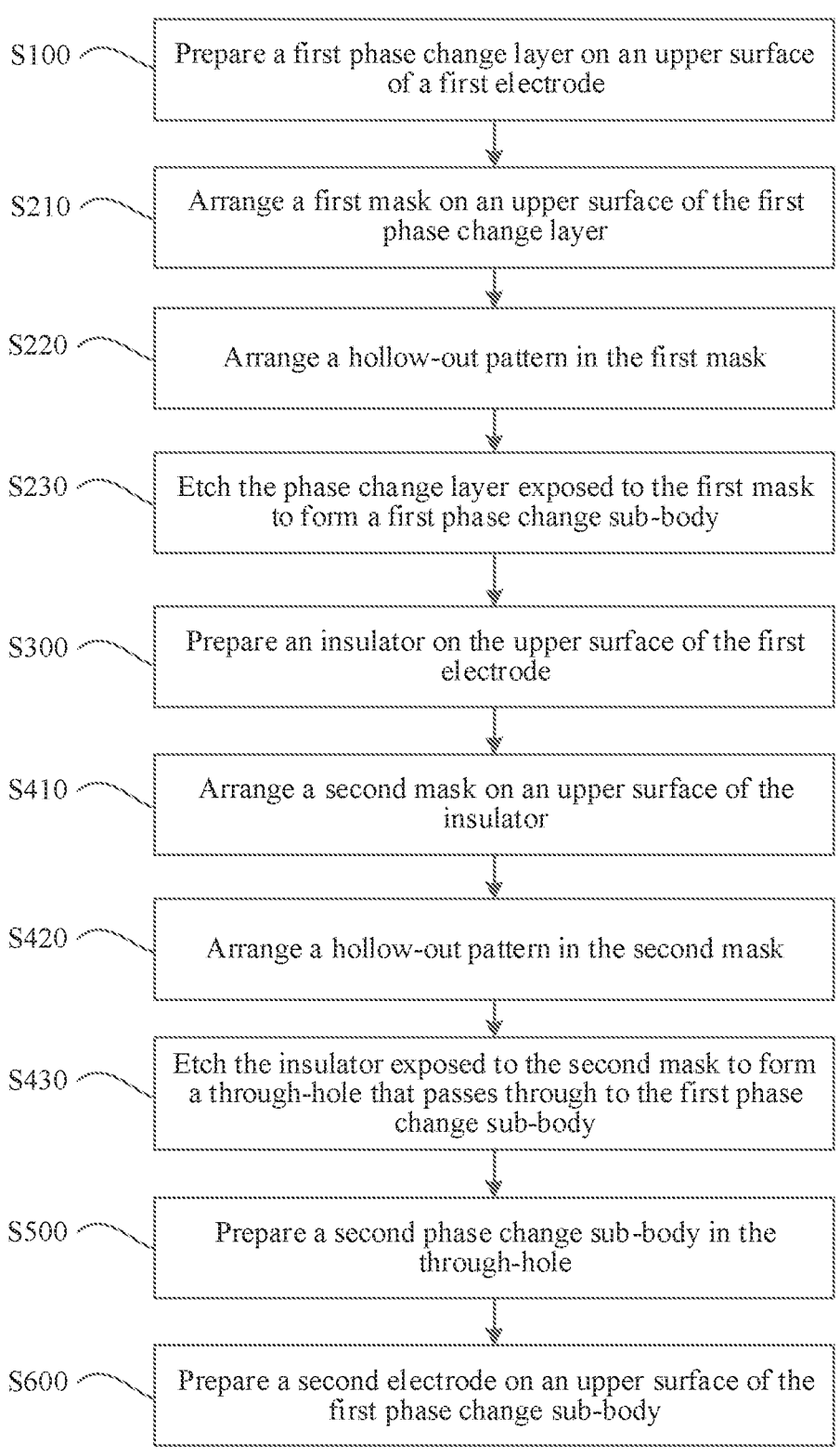

S100 — Prepare a first phase change layer on an upper surface of a first electrode S210 — Arrange a first mask on an upper surface of the first phase change layer S220 — Arrange a hollow-out pattern in the first mask S230 — Etch the phase change layer exposed to the first mask to form a first phase change sub-body S300 — Prepare an insulator on the upper surface of the first electrode S410 — Arrange a second mask on an upper surface of the insulator S420 — Arrange a hollow-out pattern in the second mask S430 — Etch the insulator exposed to the second mask to form a through-hole that passes through to the first phase change sub-body S500 — Prepare a second phase change sub-body in the through-hole S600 — Prepare a second electrode on an upper surface of the first phase change sub-body

FIG. 21

PHASE CHANGE MEMORY, ELECTRONIC DEVICE, AND PREPARATION METHOD FOR PHASE CHANGE MEMORY

CROSS-REFERENCE TO RELATED APPLICATIONS

This application is a continuation of International Application No. PCT/CN2022/088232, filed on Apr. 21, 2022, which claims priority to Chinese Patent Application No. 202110663808.8, filed on Jun. 16, 2021, both of which are hereby incorporated by reference in their entireties.

TECHNICAL FIELD

This application relates to the field of data storage technologies, and in particular, to a phase change memory, an electronic device, and a preparation method for a phase change memory.

BACKGROUND

A phase change memory is a non-volatile storage device, which stores information mainly by virtue of a reversible phase change of a phase change material. For example, a sulfur compound has a large resistance difference between a crystalline state and an amorphous state, and the phase change memory implements an information storage function by using the resistance difference between the crystalline state and the amorphous state of the sulfur compound, and even implements multi-level storage by using resistance states of different levels, thereby implementing a high storage density. In actual application, the phase change memory mainly changes a temperature of the phase change material, to implement mutual conversion between the crystalline state and the amorphous state of the phase change material.

In the current phase change memory, regions in which temperature changes occur in the phase change material are mainly concentrated at interfaces between the phase change material and electrodes. Materials between the phase change material and the electrodes are different, and problems such as poor contact and poor adhesion are prone to occur between the electrodes and the phase change material in a long-term use process, thereby causing a data loss or even a failure, or the like. Therefore, this is inconducive to ensuring reliability and a cycle life of the phase change memory.

SUMMARY

This application provides a phase change memory with high reliability and a long cycle life, an electronic device, and a preparation method for a phase change memory.

According to an aspect, an embodiment of this application provides a phase change memory, including a plurality of phase change memory cells. Each of the plurality of phase change memory cells includes a first electrode, a phase change body, and a second electrode. The first electrode, the phase change body, and the second electrode are sequentially arranged in a first direction. The phase change body has a first end face and a second end face. The first end face faces the first electrode, and the second end face faces the second electrode. The phase change body further includes a convergence portion, and the convergence portion is located between the first end face and the second end face, where a sectional area of the convergence portion in a direction perpendicular to the first direction is less than an area of the first end face and an area of the second end face.

In the phase change memory cell provided in this embodiment of this application, the convergence portion is arranged in the phase change body, so that the sectional area of the convergence portion is less than a contact area between the phase change body and the first electrode, and the sectional area of the convergence portion is less than a contact area between the phase change body and the second electrode. When a current flows in a series path formed by the first electrode, the phase change body, and the second electrode, because the sectional area of the convergence portion is small, a current density is high in the convergence portion, thereby aggregating a thermal effect in the convergence portion. A phase change material of the convergence portion is converted between a crystalline state and an amorphous state, to implement data storage. Alternatively, it may be understood that, because a region in which the thermal effect is generated includes only the phase change material, in a plurality of repeated erase/write (or reset/set) processes, if a problem such as element segregation occurs, the phase change material around the convergence portion spontaneously generates element migration compensation, thereby eliminating a problem of a gradient concentration difference caused by element segregation, to avoid occurrence of situations such as poor contact and poor adhesion. In addition, once a failure occurs, the phase change material in the region of the convergence portion may be melted by using a high pulse current, to eliminate a hole that may be formed due to repeated erase/write, so that the phase change memory cell can recover an erase/write capability (which may also be understood as a storage capability), thereby having high reliability and a long cycle life.

In an implementation, each phase change memory cell may further include an insulator. The insulator may be wrapped around an outer circumferential surface of the phase change body to form a protective effect on the phase change body. The outer circumferential surface of the phase change body is a surface of an outer surface, excluding the first end face and the second end face, of the phase change body.

During specific application, the entire phase change body may be understood as a structural form formed by a first phase change sub-body and a second phase change sub-body. One end face of the first phase change sub-body forms the first end face. One end face of the second phase change sub-body forms the second end face. One end of the first phase change sub-body abuts against one end of the second phase change sub-body, where an interface between the first phase change sub-body and the second phase change sub-body forms the convergence portion. In a direction perpendicular to a connection direction of the first end face and the second end face, a sectional area of a lower end face of the second phase change sub-body of the phase change body is minimum. Therefore, when a current flows in a series path formed by the first electrode, the phase change body, and the second electrode, there is a high current density at an interface between the lower end face of the second phase change sub-body and an upper end face of the first phase change sub-body, thereby aggregating a thermal effect in the convergence portion.

During preparation, the first phase change sub-body and the second phase change sub-body may be separately manufactured, thereby reducing preparation difficulty. Alternatively, it may be understood that, if it is very difficult to prepare the entire phase change body based on a current preparation process, the first phase change sub-body and the second phase change sub-body may be separately manufactured, and then the entire phase change body is formed, thereby improving flexibility during preparation.

During specific application, the first phase change sub-body may be in a shape of a cylinder, and the second phase change sub-body may be in a shape of an inverted truncated cone. Alternatively, the first phase change sub-body may be in a shape of a truncated cone, and the second phase change sub-body may be in a shape of a cylinder.

It may be understood that, specific structural shapes of the first phase change sub-body and the second phase change sub-body are not limited in this application. Alternatively, it may be understood that, a structural shape of the entire phase change body is not limited in this application.

In addition, the convergence portion may be located in a position in the phase change body close to the first end face, or may be located in a position in the phase change body close to the second end face. Alternatively, the convergence portion may be located in a middle position. To be specific, the convergence portion may be at equal or approximately equal distances from the first end face and the second end face.

During specific application, the phase change memory may include a plurality of phase change memory cells.

During layout, the plurality of phase change memory cells may be arranged in an array on a plane perpendicular to the first direction. Alternatively, the plurality of phase change memory cells may be stacked in the first direction.

It may be understood that, in another implementation, the plurality of phase change memory cells in the phase change memory may be not only arranged in an array on a plane perpendicular to the first direction, but also stacked in the first direction. A position layout of the phase change memory cells is not specifically limited in this application.

According to another aspect, this application further provides an electronic device, which may include a controller and a phase change memory. The controller is electrically connected to a first electrode and a second electrode in the phase change memory, and is configured to perform a data read/write operation on each phase change memory cell in the phase change memory, to implement functions such as data storage, erasing, and reading. During specific application, the electronic device may be a computer, a data center, or the like. A specific type of the electronic device is not limited in this application.

When the phase change memory is manufactured, a plurality of different technical processes may be used.

For example, this application further provides a preparation method for a phase change memory, including:

preparing a phase change layer on an upper surface of a first electrode;

etching the phase change layer to form a phase change body, where the phase change body has a convergence portion;

arranging a mask on an upper surface of the phase change layer;

arranging a hollow-out pattern in the mask, to enable a part of the upper surface of the phase change layer to be exposed to the mask;

etching the phase change layer exposed to the mask to form a phase change body, where the phase change body has a convergence portion;

preparing an insulator on the upper surface of the first electrode, where the insulator is wrapped around an outer circumferential surface of the phase change body; and preparing a second electrode on an upper surface of the phase change body.

The etching the phase change layer may include the following steps:

arranging a mask on an upper surface of the phase change layer;

arranging a hollow-out pattern in the mask, to enable a part of the upper surface of the phase change layer to be exposed to the mask;

etching the phase change layer exposed to the mask.

During preparation, a shape of the hollow-out pattern may be properly set based on a required shape of the phase change body. In addition, an etching time may be properly regulated based on a required shape of the convergence portion.

In addition, during specific implementation, to ensure flatness of the second electrode and a binding effect between the second electrode and the phase change body, before the arranging a second electrode on an upper surface of the phase change body, the method may further include: flattening an upper surface of the insulator and the upper surface of the phase change body, to enable the upper surface of the insulator to be flush with the upper surface of the phase change body and have good flatness. In addition, the flatness of the second electrode and the binding effect between the second electrode and the phase change body can also be effectively ensured.

In addition, this application further provides another preparation method for a phase change memory, including:

preparing a first phase change layer on an upper surface of a first electrode;

etching the first phase change layer to form a first phase change sub-body;

preparing an insulator on the upper surface of the first electrode, where a thickness of the insulator is greater than a thickness of the first phase change layer;

etching the insulator to form a through-hole that passes through to the first phase change sub-body;

arranging a first mask on an upper surface of the first phase change layer;

preparing a second phase change sub-body in the through-hole; and preparing a second electrode on an upper surface of the second phase change sub-body.

The etching the first phase change layer may include the following steps:

arranging a first mask on an upper surface of the first phase change layer;

arranging a hollow-out pattern in the first mask, to enable a part of the upper surface of the first phase change layer to be exposed to the first mask; and etching the first phase change layer exposed to the first mask.

It may be understood that, during preparation, a shape of the hollow-out pattern may be properly set based on a required shape of the first phase change sub-body. In addition, an etching time may be properly regulated based on a required shape of the first phase change sub-body.

The etching the insulator may include the following steps:

arranging a second mask on an upper surface of the insulator;

arranging a hollow-out pattern in the second mask, to enable a part of the upper surface of the insulation layer to be exposed to the second mask; and etching the insulator exposed to the second mask.

During preparation, a shape of the hollow-out pattern may be properly set based on a required shape of the through-hole (or the second phase change sub-body). An etching time may also be properly regulated based on a required shape of the through-hole.

In addition, during specific implementation, to ensure flatness of the second electrode and a binding effect between the second electrode and the second phase change sub-body, before the arranging a second electrode on an upper surface of the second phase change sub-body, the method may further include: flattening the upper surface of the insulator and the upper surface of the second phase change sub-body, to enable the upper surface of the insulator to be flush with the upper surface of the second phase change sub-body. In addition, the flatness of the second electrode and the binding effect between the second electrode and the second phase change sub-body can also be effectively ensured.

BRIEF DESCRIPTION OF DRAWINGS

FIG. 14 is a flowchart of another preparation method for a phase change memory according to an embodiment of this application;

FIG. 15 is a structural diagram of a preparation process of a phase change memory according to an embodiment of this application;

FIG. 19 is a structural diagram of another preparation process of a phase change memory according to an embodiment of this application;

FIG. 20 is a flowchart of another preparation method for a phase change memory according to an embodiment of this application;

FIG. 21 is a flowchart of another preparation method for a phase change memory according to an embodiment of this application;

DESCRIPTION OF EMBODIMENTS

To make the objectives, technical solutions, and advantages of this application clearer, the following further describes this application in detail with reference to the accompanying drawings.

To facilitate understanding of a phase change memory provided in embodiments of this application, the following first describes an application scenario of the hard drive backplane assembly and the electronic device.

The phase change memory (phase change memory, PCM) stores data by using a conductivity (or resistivity) difference shown when a phase change material is converted between a crystalline state and an amorphous state. For example, in the amorphous state, the phase change material has a short-distance atomic energy level and a low free electron density, and therefore has a high resistivity. The amorphous state usually occurs after a reset operation on the phase change memory, and therefore is also generally referred to as a reset state. In the crystalline state, the phase change material has a long-distance atomic energy level and a high free electron density, and therefore has a low resistivity. The crystalline state usually occurs after a set operation on the phase change memory, and therefore is also generally referred to as a set state. When storing data, the phase change memory mainly controls a heating temperature of the phase change material, so that the phase change material is converted between the crystalline state and the amorphous state. For example, when the reset operation is performed, a pulse current with a short time and a high strength is applied to a phase change memory cell, so that the phase change material undergoes annealing quickly after the temperature of the phase change material rises to a temperature slightly higher than the melting point, so that the phase change material has a high resistivity. When the set operation is performed, a pulse current with a long time and a moderate strength is applied to the phase change memory cell, so that the temperature of the phase change material increases to a temperature higher than the recrystallization temperature and lower than the melting point, and then the phase change material cools slowly, so that the phase change material has a low resistivity.

Structurally, the phase change memory generally includes a plurality of phase change memory cells.

Figure 1:
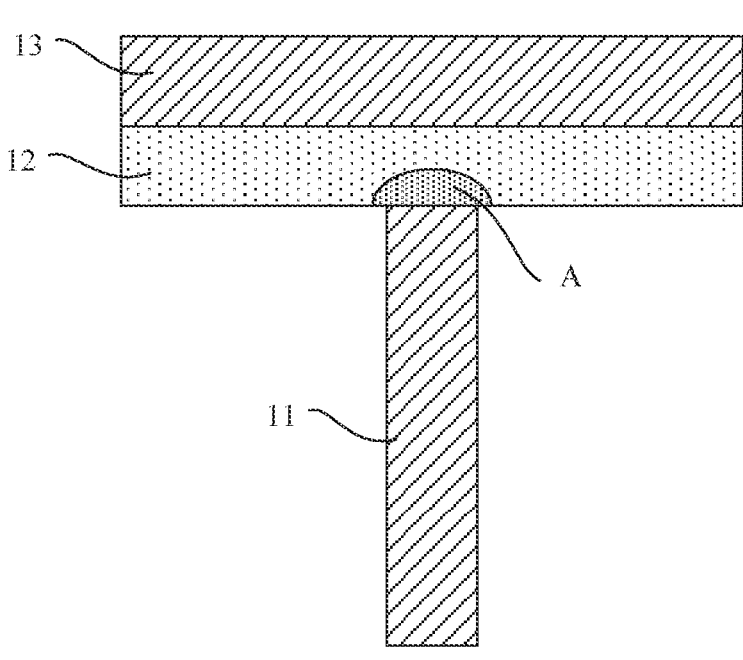
FIG. 1 is a sectional view of a typical phase change memory cell according to an embodiment of this application.

As shown in FIG. 1, a typical phase change memory cell 10 usually includes a first electrode 11, a phase change body 12 (or a phase change material), and a second electrode 13. The first electrode 11, the phase change body 12, and the second electrode 13 are sequentially connected, to form a series structure. It can be learned from the figure that, a sectional area of the first electrode 11 is small. When a current flows in a series path formed by the first electrode 11, the phase change body 12, and the second electrode 13, because the sectional area of the first electrode 11 is small, a high current density exists in the first electrode 11, thereby aggregating a thermal effect in the first electrode 11. Because an upper end of the first electrode 11 abuts against the phase change body 12, the first electrode 11 may heat the phase change body 12, so that a region A of the phase change body 12 is converted between a crystalline state and an amorphous state, thereby implementing data storage.

In actual application, the first electrode 11 and the second electrode 13 are usually made of materials with good conductivity and high thermal stability, such as copper, and the phase change body 12 is usually made of a material such as a sulfur compound, that is, the materials of the first electrode 11 and the second electrode 13 are different from the material of the phase change body 12. Therefore, when the phase change body 12 is converted between the crystalline state and the amorphous state for a plurality of times, a problem such as element segregation easily occurs between the phase change body 12 and the first electrode 11, resulting in a gradient concentration difference between elements, and problems such as poor contact and poor adhesion easily occur between the phase change body 12 and the first electrode 11. Finally, adverse situations such as low reliability and a short cycle life occur.

Therefore, an embodiment of this application provides a phase change memory with high reliability and a long cycle life.

To make objectives, technical solutions, and advantages of this application clearer, the following further describes this application in detail with reference to the accompanying drawings and specific embodiments.

Terms used in the following embodiments are merely intended to describe specific embodiments, and are not intended to limit this application. Terms "one", "a", and "the" of singular forms used in this specification and the appended claims of this application are also intended to include a form like "one or more", unless otherwise specified in the context clearly. It should be further understood that, in the following embodiments of this application, "at least one" means one, two, or more.

Reference to "one embodiment" described in this specification or the like means that one or more embodiments of this application include a particular feature, structure, or characteristic described with reference to embodiments. Therefore, statements such as "in an embodiment", "in some embodiments", and "in other embodiments" that appear at different places in this specification do not necessarily mean reference to a same embodiment, instead, the statements mean "one or more but not all of embodiments", unless otherwise specifically emphasized in another manner. Terms "include", "have", and their variants all mean "include but are not limited to", unless otherwise specifically emphasized in another manner.

Figure 2:
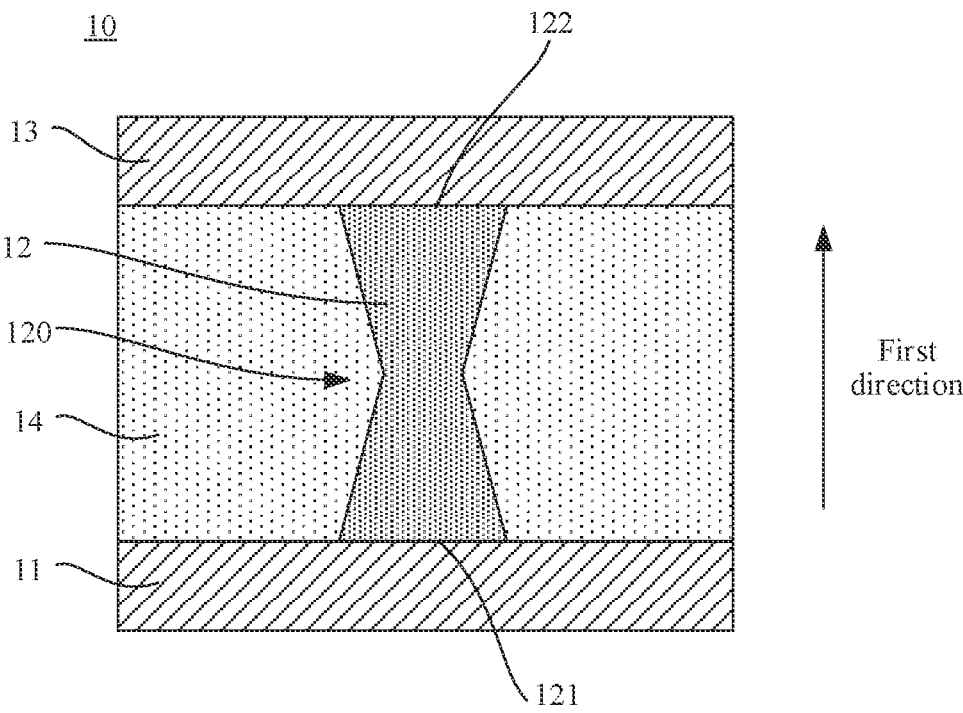
FIG. 2 is a sectional view of a phase change memory cell according to an embodiment of this application.

As shown in FIG. 2, a phase change memory cell 10 in a phase change memory is shown. The phase change memory cell 10 includes: a first electrode 11, a phase change body 12, a second electrode 13, and an insulator 14. The first electrode 11, the phase change body 12, and the second electrode 13 are sequentially arranged in a first direction. The insulator 14 is wrapped around an outer circumferential surface of the phase change body 12. The phase change body 12 has a first end face 121 (a lower end face in the figure) and a second end face 122 (an upper end face in the figure). The outer circumferential surface of the phase change body 12 is a surface that is of an outer surface of the phase change body 12 and that excludes the first end face 121 and the second end face 122. The first end face 121 faces the first electrode 11, and is connected to the first electrode 11. The second end face 122 faces the second electrode 13, and is connected to the second electrode 13. The phase change body 12 further includes a convergence portion 120, and the convergence portion 120 is located between the first end face 121 and the second end face 122, where a sectional area of the convergence portion 120 in a direction perpendicular to the first direction is less than an area of the first end face 121 and an area of the second end face 122. During specific implementation, that the first end face 121 is connected to the first electrode 11 means that the first end face 121 may be directly connected to the first electrode 11. Alternatively, the first end face 121 may be indirectly connected to the first electrode 11 through a gating tube or another medium. Correspondingly, that the second end face 121 is connected to the second electrode 13 means that the second end face 122 may be directly connected to the second electrode 13. Alternatively, the second end face 122 may be indirectly connected to the second electrode 13 through a gating tube or another medium.

In the phase change memory cell 10 provided in this embodiment of this application, the convergence portion 120 is arranged in the phase change body 12, so that the sectional area of the convergence portion 120 is less than a contact area between the phase change body 12 and the first electrode 11, and the sectional area of the convergence portion 120 is less than a contact area between the phase change body 12 and the second electrode 13. When a current flows in a series path formed by the first electrode 11, the phase change body 12, and the second electrode 13, because the sectional area of the convergence portion 120 is small, a current density is high in the convergence portion 120, thereby aggregating a thermal effect in the convergence portion 120. A phase change material of the convergence portion 120 is converted between a crystalline state and an amorphous state, to implement data storage. Alternatively, it may be understood that, because a region in which the thermal effect is generated includes only the phase change material, in a plurality of repeated erase/write (or reset/set) processes, if a problem such as element segregation occurs, the phase change material around the convergence portion 120 spontaneously generates element migration compensation, thereby eliminating a problem of a gradient concentration difference caused by element segregation, to avoid occurrence of situations such as poor contact and poor adhesion. In addition, once a failure occurs, the phase change material in the region of the convergence portion 120 may be melted by using a high pulse current, to eliminate a hole that may be formed due to repeated erase/write, so that the phase change memory cell 10 can recover an erase/write capability (which may also be understood as a storage capability), thereby having high reliability and a long cycle life.

It should be noted that the area of the first end face 121 may alternatively be understood as the contact area between the phase change body 12 and the first electrode 11. Correspondingly, the area of the second end face 122 may alternatively be understood as the contact area between the phase change body 12 and the second electrode 13. In addition, the area of the first end face 121 may be the same as or different from the area of the second end face 122. When the area of the first end face 121 is the same as the area of the second end face 122, the sectional area of the convergence portion 120 in the direction perpendicular to the first direction is less than the area of the first end face 121 or the area of the second end face 122. When the area of the first end face 121 is less than the area of the second end face 122, the sectional area of the convergence portion 120 in the direction perpendicular to the first direction is less than the area of the first end face 121. Correspondingly, when the area of the first end face 121 is greater than the area of the second end face 122, the sectional area of the convergence portion 120 in the direction perpendicular to the first direction is less than the area of the second end face 122.

During specific implementation, the phase change body 12 may be diversified in shape and structure. Alternatively, it may be understood that, the convergence portion 120 may be diversified in shape and structure.

For example, as shown in FIG. 2, in an embodiment provided in this application, the phase change body 12 gradually converges from the first end face 121 and the second end face 122 to the middle. A region in which the sectional area of the phase change body 12 in the direction perpendicular to the first direction is minimum forms the convergence portion 120.

During specific implementation, when the phase change body 12 gradually converges from the first end face 121 and the second end face 122 to the middle, a convergence trend may be flexibly set. For example, in the phase change body 12 shown in FIG. 2, the phase change body 12 converges in a straight line from the first end face 121 to the middle, and the phase change body 12 converges in a straight line from the second end face 122 to the middle.

Certainly, in another implementation, the convergence trend may alternatively be set to be an arc or an irregular curve.

Figure 3:
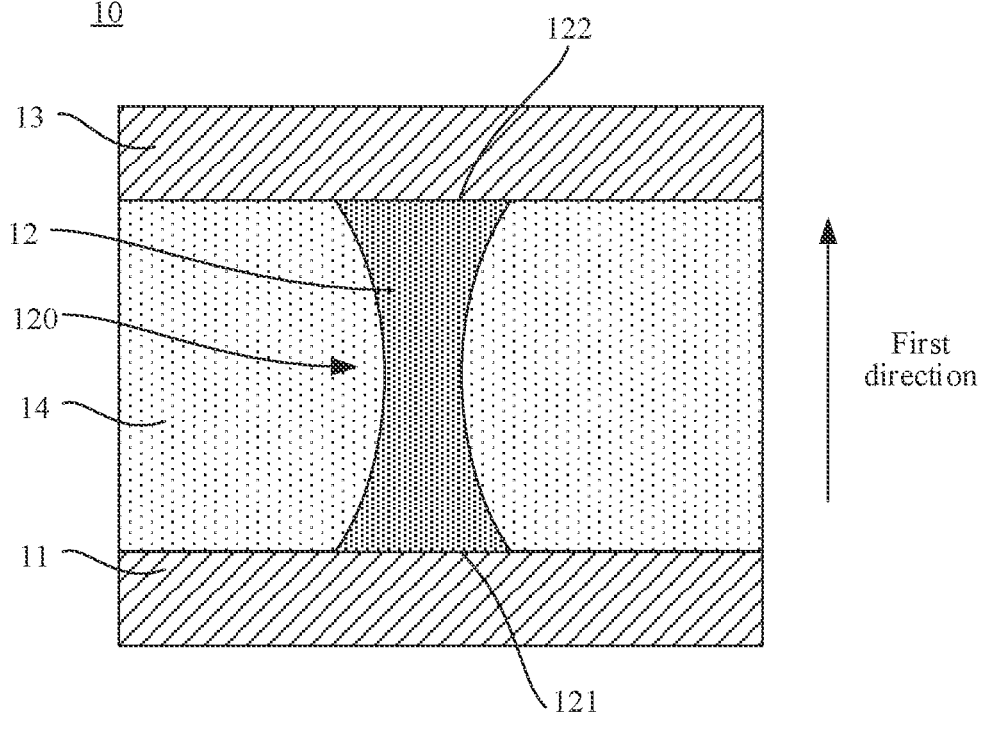
FIG. 3 is a sectional view of another phase change memory cell according to an embodiment of this application.

For example, as shown in FIG. 3, in another embodiment provided in this application, a phase change body 12 gradually converges in an arc shape from a first end face 121 and a second end face 122 to the middle smoothly.

It may be understood that, during specific implementation, a specific shape or contour of the phase change body 12 is not limited in this application, provided that a minimum section (that is, a convergence portion 120) of the phase change body 12 is located between the first end face 121 and the second end face 122 in a direction perpendicular to a first direction. In addition, the convergence portion 120 may be at equal distances or not be at equal distances from the first end face 121 and the second end face 122. Alternatively, it may be understood that, in the first direction, the convergence portion 120 may be located in the middle of the phase change body 12, may be located in a position close to the first end face 121, or may be located in a position close to the second end face 122.

In phase change memory cells 10 shown in FIG. 2 and FIG. 3, both upper and lower sides of the convergence portion 120 are in a structural form of smooth transition. It may be understood that, in another implementation, one side of the convergence portion 120 may alternatively be in a structural form of abrupt change.

Figure 4:
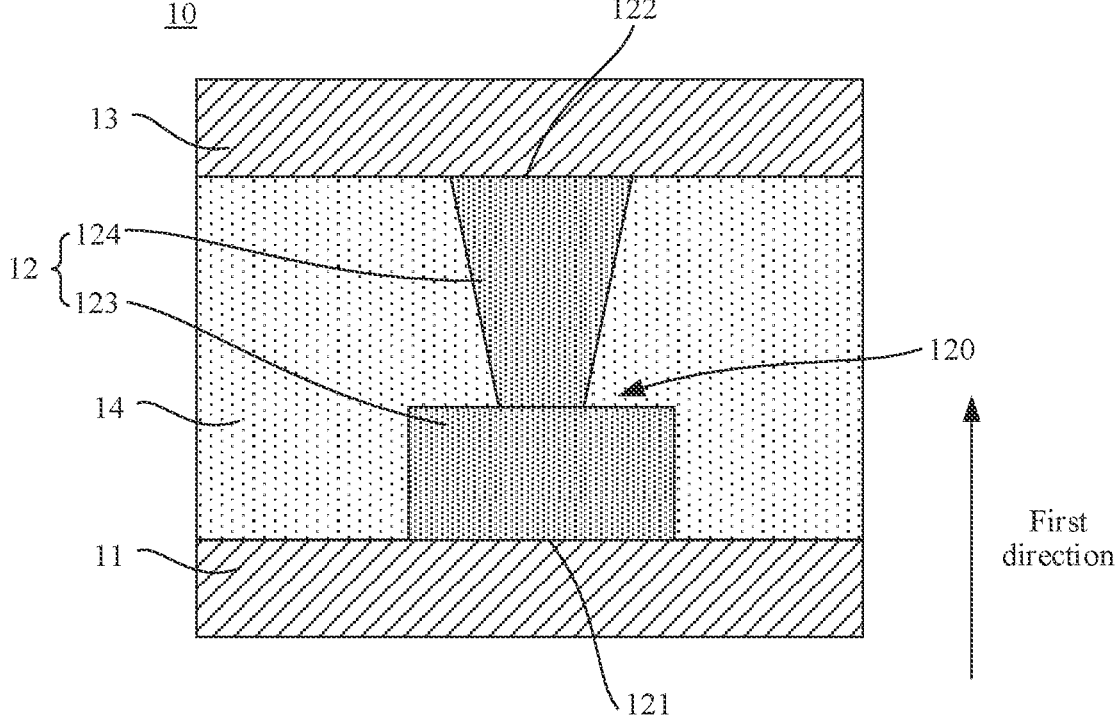
FIG. 4 is a sectional view of another phase change memory cell according to an embodiment of this application.

For example, as shown in FIG. 4, in another embodiment provided in this application, an upper side of a convergence portion 120 is in a structural form of smooth transition, and a lower side of the convergence portion 120 is in a structural form of abrupt change. Specifically, an entire phase change body 12 may be understood as a structural form formed by a first phase change sub-body 123 and a second phase change sub-body 124. The first phase change sub-body 123 is a structure in a shape of a cylinder, and the second phase change sub-body 124 is a structure in a shape of an inverted truncated cone. A lower end face of the first phase change sub-body 123 forms a first end face 121, and is connected to a first electrode 11. An upper end face of the second phase change sub-body 124 forms a second end face 122, and is connected to a second electrode 13. An upper end face of the first phase change sub-body 123 abuts against a lower end face of the second phase change sub-body 124, where an interface between the first phase change sub-body 123 and the second phase change sub-body 124 forms the convergence portion 120. In a direction perpendicular to a first direction, a sectional area of the lower end face of the second phase change sub-body 124 of the phase change body 12 is minimum. Therefore, when a current flows in a series path formed by the first electrode 11, the phase change body 12, and the second electrode 13, there is a high current density at an interface between the lower end face of the second phase change sub-body 124 and the upper end face of the first phase change sub-body 123, thereby aggregating a thermal effect in the convergence portion 120.

In addition, during specific application, the phase change body 12 may alternatively be inverted.

Figure 5:
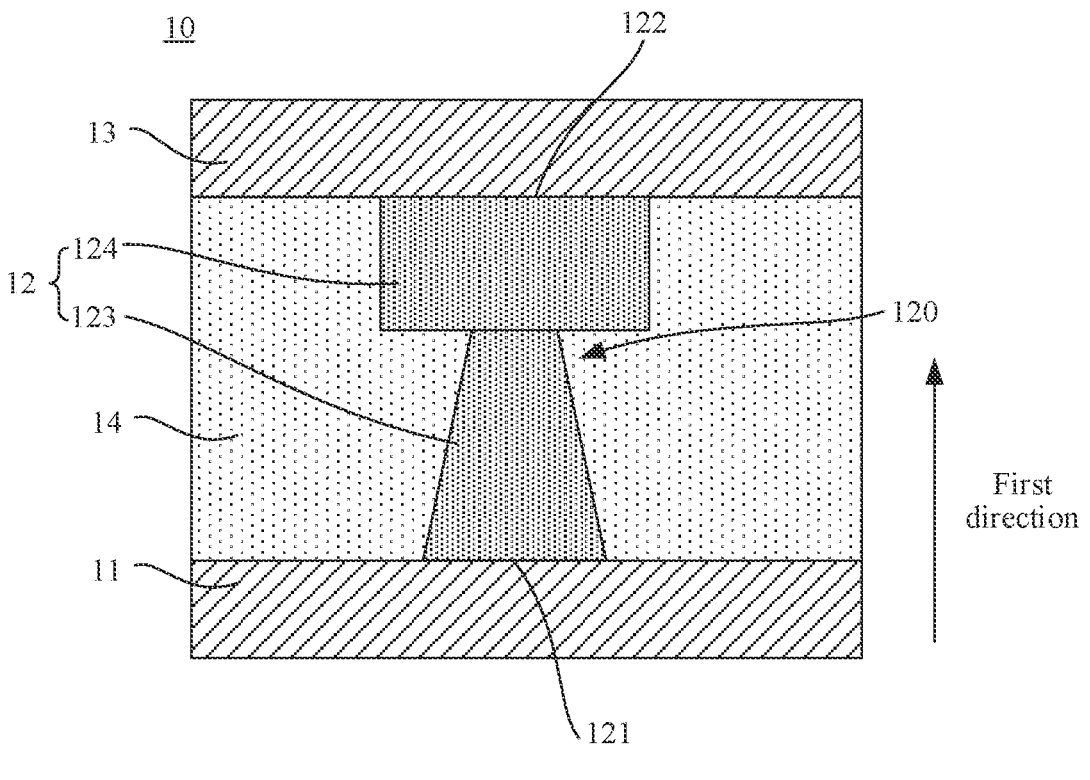
FIG. 5 is a sectional view of another phase change memory cell according to an embodiment of this application.

Specifically, as shown in FIG. 5, in another embodiment provided in this application, a first phase change sub-body 123 is a structure in a shape of a truncated cone, and a second phase change sub-body 124 is a structure in a shape of a cylinder.

During specific application, in a first direction, lengths of the first phase change sub-body 123 and the second phase change sub-body 124 may be the same or may be different. Alternatively, it may be understood that, in the first direction, an interface between the first phase change sub-body 123 and the second phase change sub-body 124 may be located in the middle of a phase change body 12, may be located in a position close to a first end face 121, or may be located in a position close to a second end face 122.

It may be understood that, the first phase change sub-body 123 and the second phase change sub-body 124 are two virtual segments in the phase change body 12. In actual application, the first phase change sub-body 123 and the second phase change sub-body 124 may be understood as an integrated structure.

Certainly, during specific application, specific shapes or contours of the first phase change sub-body 123 and the second phase change sub-body 124 are not limited in this application, provided that a minimum section (that is, a convergence portion 120) of the phase change body 12 is located between the first end face 121 (for example, a lower end face in the figure) and the second end face 122 (for example, an upper end face in the figure) in a direction perpendicular to the first direction.

It may be understood that, in structures shown in FIG. 2 to FIG. 5, the convergence portion 120 is a section in the direction perpendicular to the first direction, and an area of the section is less than an area of the first end face 121 and an area of the second end face 122.

In another implementation, the convergence portion 120 may alternatively be a structure of a segment in the first direction.

Figure 6:
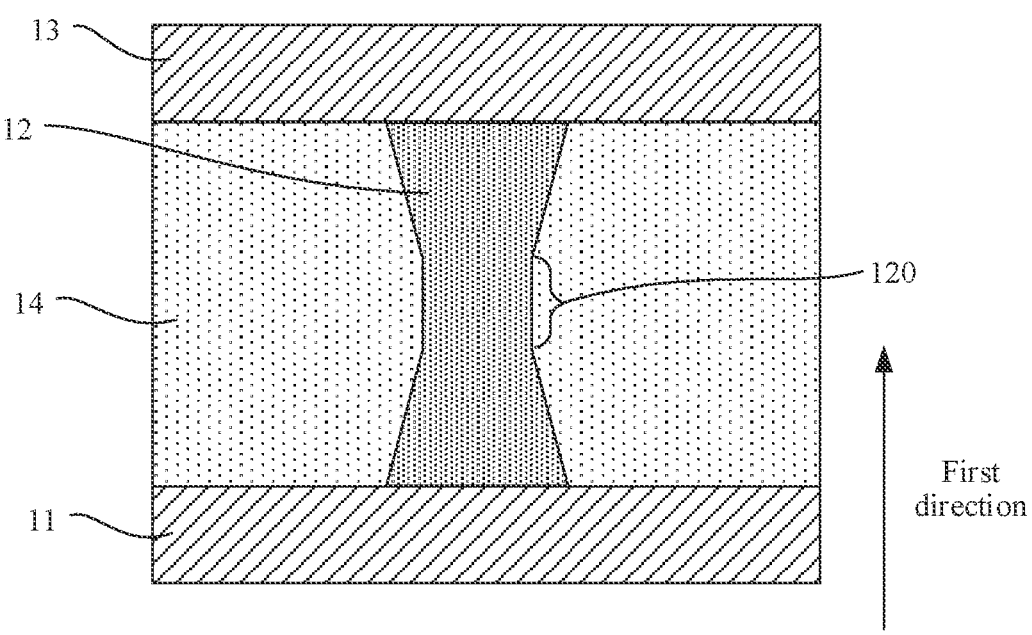
FIG. 6 is a sectional view of another phase change memory cell according to an embodiment of this application.

For example, as shown in FIG. 6, in another embodiment provided in this application, in a direction perpendicular to a first direction, a sectional area of a segment in the middle of a phase change body 12 is approximately the same, and is less than an area of a first end face 121 and an area of a second end face 122. To be specific, a region of the segment in the phase change body 12 forms a convergence portion 120.

In summary, during specific implementation, between the first end face 121 and the second end face 122 of the phase change body 12, a sectional area is less than an area of the first end face 121 and an area of the second end face 122. Alternatively, the convergence portion 120 may be a structure of a segment between the first end face 121 and the second end face 122 of the phase change body 12. A specific structural form of the convergence portion 120 is not limited in this application.

During specific application, the phase change body 12 may be made of a phase change material such as a sulfur compound. A specific material component of the phase change body 12 is not limited in this application.

Main functions of an insulator 14 mainly include two aspects. In one aspect, the insulator 14 is located between a first electrode 11 and a second electrode 13, and can effectively perform electrical isolation between the first electrode 11 and the second electrode 13, to prevent an adverse situation such as a short circuit between the first electrode 11 and the second electrode 13. In the other aspect, the insulator 14 protects the phase change body 12 peripherally, so that the phase change body 12 can be well protected, and diffusion of the phase change material can be effectively prevented. In actual application, a material selected for the insulator 14 needs to have a high melting point and good thermal stability, and can still maintain good insulating performance at a high temperature. The material of the insulator 14 may be silicon dioxide or the like. A specific material component of the insulator 14 is not limited in this application.

A main function of the first electrode 11 and the second electrode 13 is to connect to a circuit in a phase change memory, so that the first electrode 11, the phase change body 12, and the second electrode 13 jointly form a series loop. During specific application, the first electrode 11 and the second electrode 13 may be made of materials with good conductivity, such as copper. The materials of the first electrode 11 and the second electrode 13 are not specifically limited in this application.

For the phase change memory, during specific application, the phase change memory may include a plurality of phase change memory cells 10.

Figure 7:
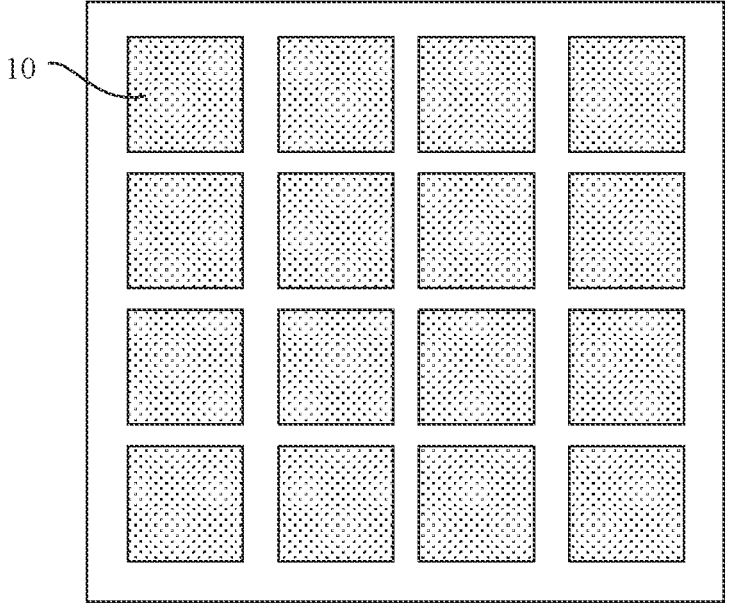
FIG. 7 is a schematic diagram of a planar structure of a phase change memory according to an embodiment of this application.

As shown in FIG. 7, during layout, a plurality of (16 shown in the figure) phase change memory cells 10 may be arranged in an array on a plane perpendicular to a first direction.

Figure 8:
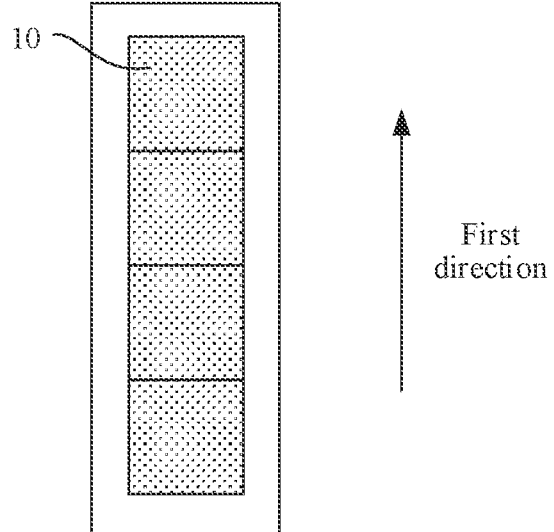
FIG. 8 is a schematic diagram of a lateral structure of a phase change memory according to an embodiment of this application.

Alternatively, as shown in FIG. 8, a plurality of (four shown in the figure) phase change memory cells 10 may be stacked in a first direction.

Figure 9:
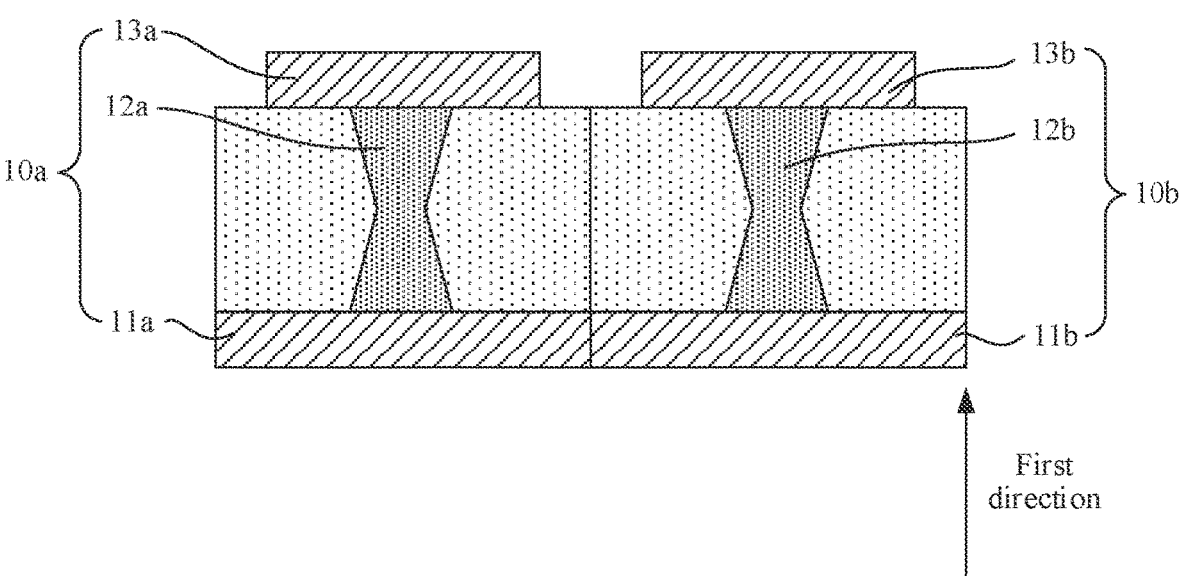
FIG. 9 is a partial sectional view of a phase change memory according to an embodiment of this application.

As shown in FIG. 9, two phase change memory cells are used as an example. In the figure, the two phase change memory cells are a phase change memory cell 10a and a phase change memory cell 10b. In the phase change memory cell 10a, a first electrode 11a, a phase change body 12a, and a second electrode 13a are sequentially arranged in a first direction. In the phase change memory cell 10b, a first electrode 11b, a phase change body 12b, and a second electrode 13b are sequentially arranged in the first direction. In addition, the phase change memory cell 10a and the phase change memory cell 10b are arranged in an array on a plane perpendicular to the first direction. During specific arrangement, the second electrode 13a and the second electrode 13b are two independent structures. The first electrode 11a in the phase change memory cell 10a and the first electrode 11b in the phase change memory cell 10b may be combined into an integrated structure, to improve manufacturing convenience.

It may be understood that, in a phase change memory, when a plurality of phase change memory cells 10 are arranged in an array on a plane perpendicular to a first direction, first electrodes 11 of the plurality of phase change memory cells 10 may all be combined into an integrated structure, thereby effectively improving manufacturing convenience. In addition, in another implementation, the first electrodes 11 of all the phase change memory cells 10 may also be structures independent of each other, and the second electrodes 13 of all the phase change memory cells 10 may be combined into an integrated structure. Alternatively, both the first electrodes 11 and the second electrodes 13 of all the phase change memory cells 10 may be structures independent of each other.

Figure 10:
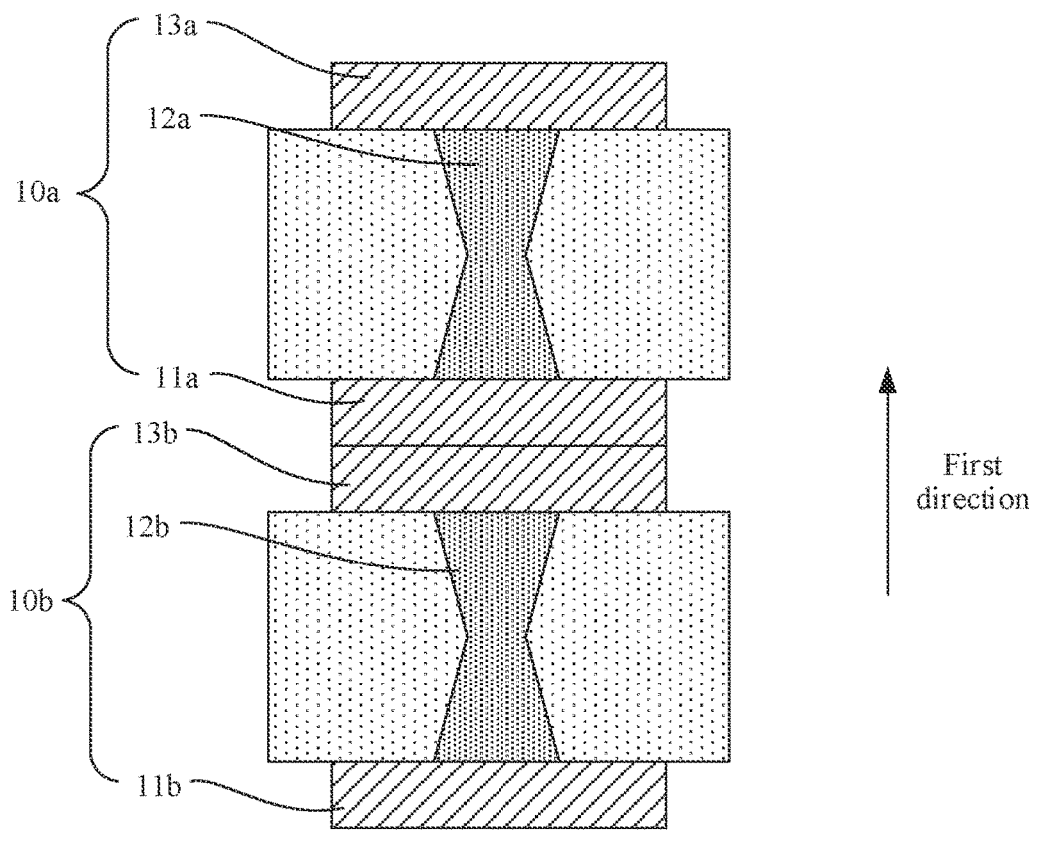
FIG. 10 is a partial sectional view of another phase change memory according to an embodiment of this application.

In addition, as shown in FIG. 10, when a plurality of phase change memory cells are stacked in a first direction, a phase change memory cell 10a and a phase change memory cell 10b are used as an example. In the phase change memory cell 10a, a first electrode 11a, a phase change body 12a, and a second electrode 13a are sequentially arranged in a first direction. In the phase change memory cell 10b, a first electrode 11b, a phase change body 12b, and a second electrode 13b are sequentially arranged in the first direction. The phase change memory cell 10a is stacked on an upper side of the phase change memory cell 10b, and the first electrode 11a is connected to the second electrode 13b.

Figures 11, 12:
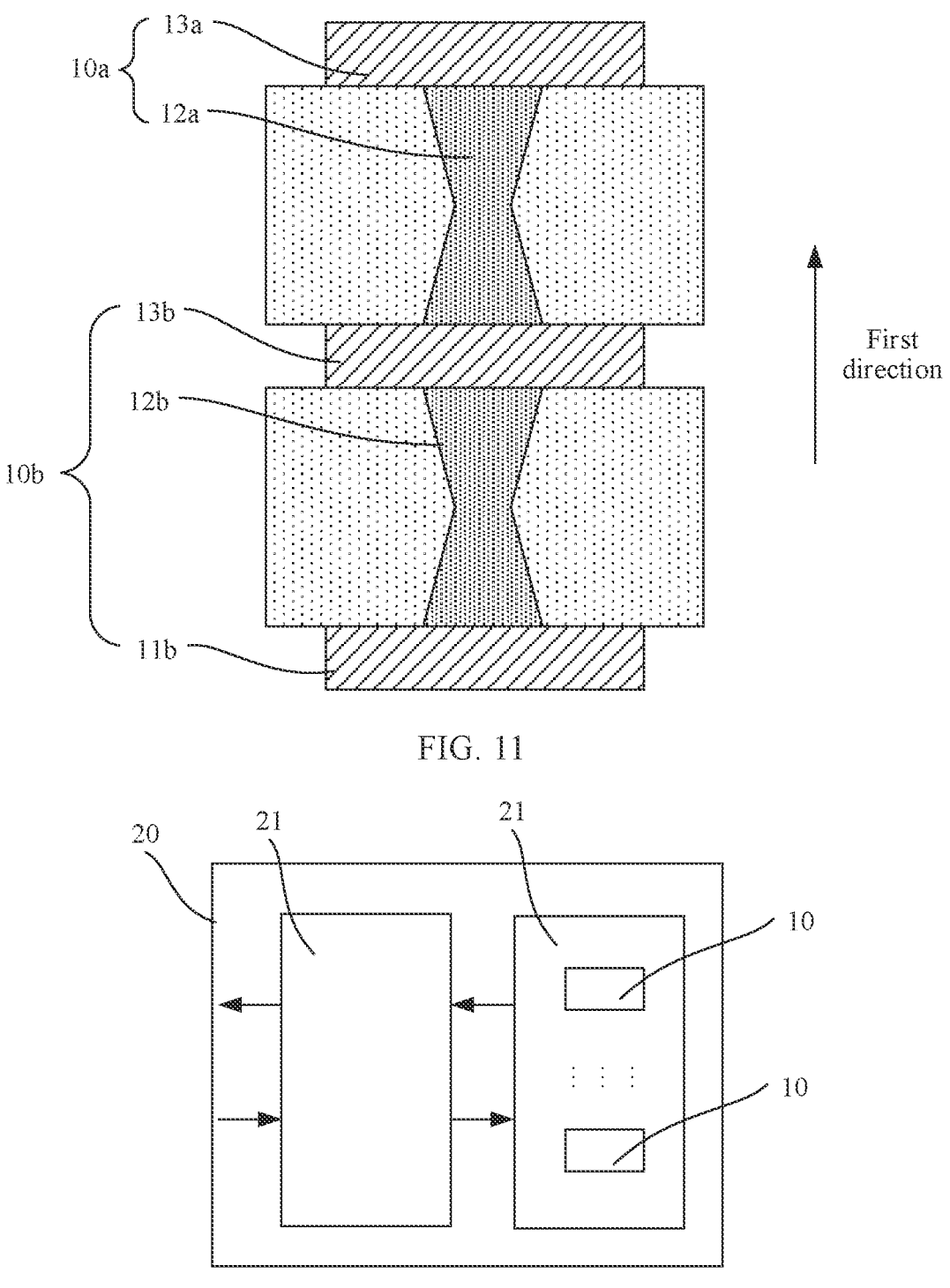
FIG. 11 is a partial sectional view of another phase change memory according to an embodiment of this application.
FIG. 12 is a framework diagram of an electronic device according to an embodiment of this application.

In addition, as shown in FIG. 11, in another implementation, the first electrode 11a shown in FIG. 10 is omitted. After the first electrode 11a is omitted, manufacturing convenience can be improved, and space occupied by the phase change memory in an opposite direction can be effectively reduced. Alternatively, it may be understood that, the second electrode 13b shown in the figure may be omitted. Alternatively, the first electrode 11a and the second electrode 13b are combined into an integrated structure.

It may be understood that, in another implementation, the plurality of phase change memory cells 10 in the phase change memory may be not only arranged in an array on a plane perpendicular to the first direction, but also stacked in the first direction. Details are not described herein.

During specific application, the phase change memory may be applied to a plurality of different types of electronic devices, and is configured to implement a data storage function.

For example, as shown in FIG. 12, an electronic device 20 provided in this application may include a controller 21 and a phase change memory 22. The controller 21 is electrically connected to a first electrode (not shown in the figure) and a second electrode (not shown in the figure) in the phase change memory 22, and is configured to perform a data read/write operation on each phase change memory cell 10 in the phase change memory 22, to implement functions such as data storage, erasing, and reading.

During specific application, the electronic device 20 may be a computer, a data center, or the like. A specific type of the electronic device 20 is not limited in this application.

When the phase change memory is manufactured, a plurality of different technical processes may be used.

Figure 13:
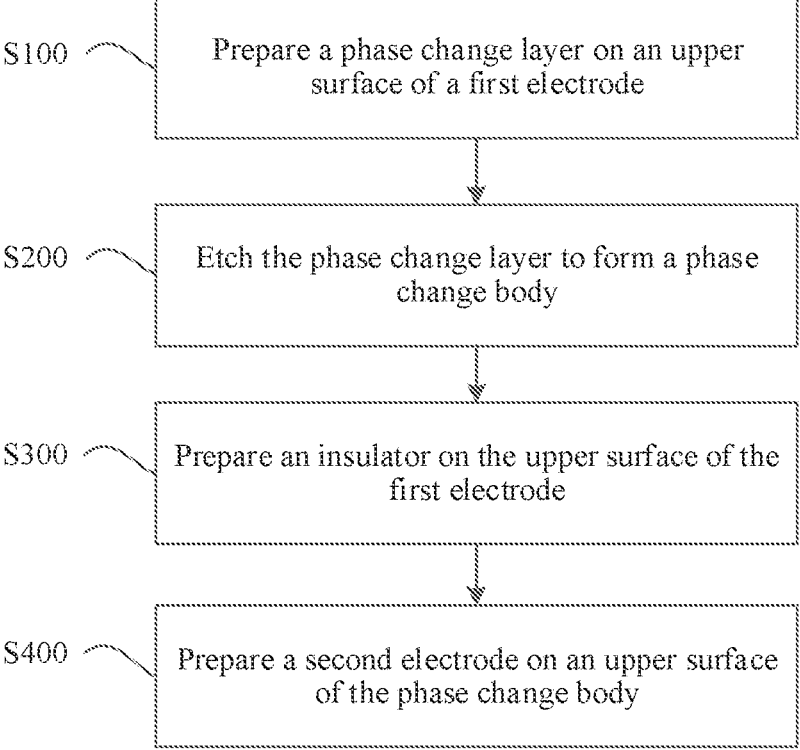
FIG. 13 is a flowchart of a preparation method for a phase change memory according to an embodiment of this application.

For example, as shown in FIG. 13, an embodiment of this application further provides a preparation method for a phase change memory, and the method may include the following steps:

Step S100: Prepare a phase change layer on an upper surface of a first electrode.

Step S200: Etch the phase change layer to form a phase change body.

Step S300: Prepare an insulator on the upper surface of the first electrode.

Step S400: Prepare a second electrode on an upper surface of the phase change body.

As shown in FIG. 14, step S200 may specifically include the following steps:

Step S210: Arrange a mask on an upper surface of the phase change layer.

Step S220: Arrange a hollow-out pattern in the mask.

Step S230: Etch the phase change layer exposed to the mask to form a phase change body.

For details, refer to FIG. 15. When step S100 is performed, a layer of phase change material with a specific thickness may be deposited on the upper surface of the first electrode 11, to form the phase change layer 012.

Figure 16:
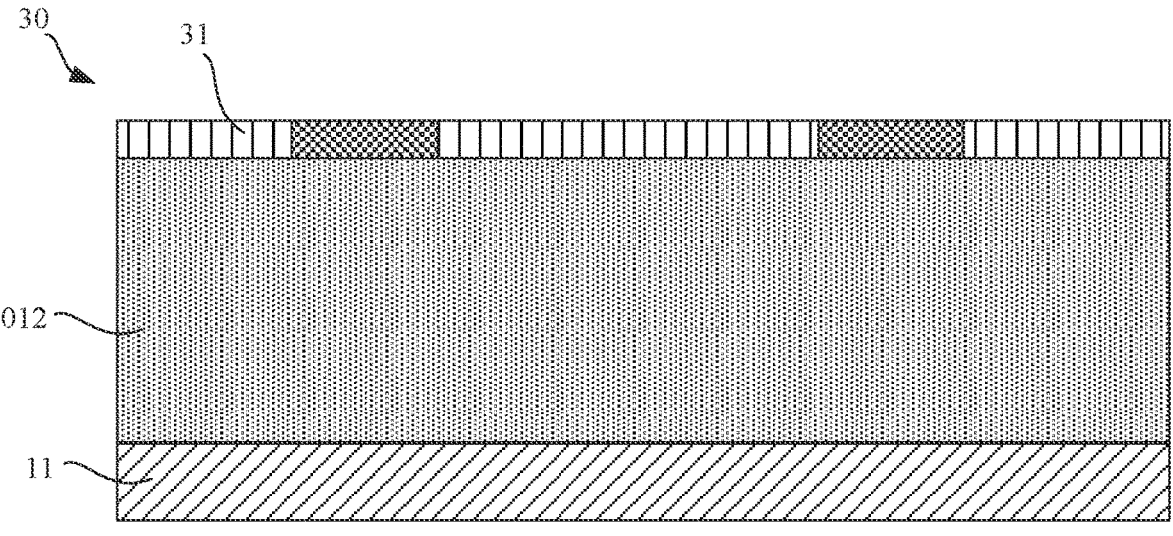
FIG. 16 is a structural diagram of another preparation process of a phase change memory according to an embodiment of this application.

Refer to FIG. 16. When step S210 and step S220 are performed, the mask 30 may be placed on the upper surface of the phase change layer 012, and then the hollow-out pattern 31 is formed by performing etching in the mask 30 through a process such as photoetching. The mask 30 mainly blocks the phase change layer 012.

Figure 17:
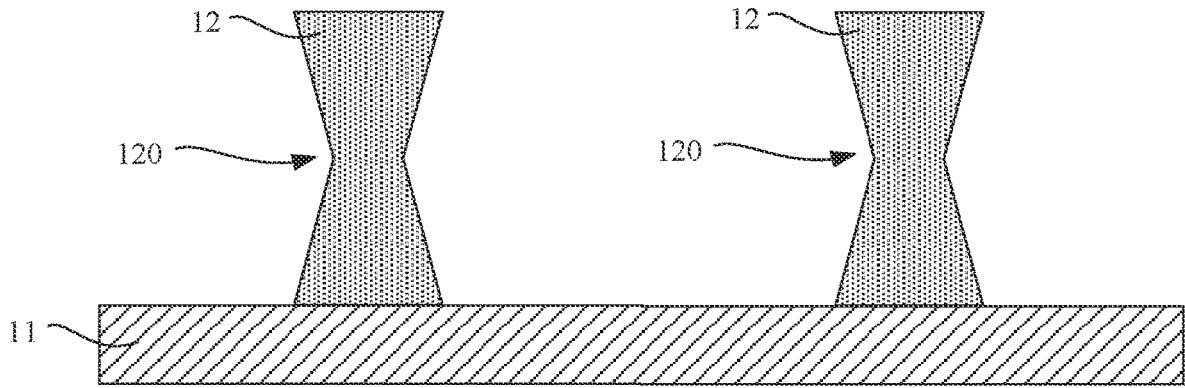
FIG. 17 is a structural diagram of another preparation process of a phase change memory according to an embodiment of this application.

Refer to FIG. 16 and FIG. 17. When step S230 is performed, a phase change material in a projection of the hollow-out pattern 31 in the mask 30 may be removed from a part exposed to the mask 30 through an etching process, to etch the phase change layer 012 into a plurality of (two shown in the figure) independent phase change bodies 12.

In addition, when the phase change layer 012 is etched, an etching time may be prolonged in a position or a position of a segment between a lower surface and the upper surface of the phase change layer 012, to remove an additional part of phase change material, thereby forming a convergence portion 120.

It may be understood that, during preparation, a shape of the hollow-out pattern 31 may be properly set based on a required shape of the phase change body 12. In addition, an etching time may be properly regulated based on a required shape of the convergence portion 120.

Figure 18:
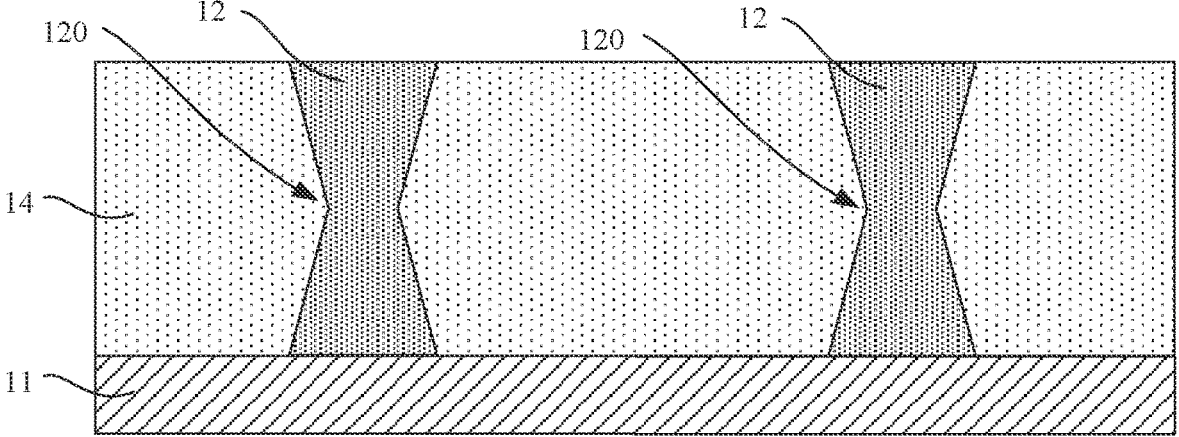
FIG. 18 is a structural diagram of another preparation process of a phase change memory according to an embodiment of this application.

Refer to FIG. 18. After the phase change body 12 is prepared and molded, step S300 may be performed to fill a gap between a plurality of phase change bodies 12 with an insulating material, so that the insulating material is wrapped around an outer circumferential surface of the phase change body 12 to form the insulator 14. The insulating material may be a material with good insulating performance and heat resistance, such as silicon dioxide.

Refer to FIG. 19. Finally, step S400 may be performed to prepare the second electrode 13 on the upper surface of the phase change body 12.

In addition, during specific implementation, to ensure flatness of the second electrode 13 and a binding effect between the second electrode 13 and the phase change body

12, before step S400 is performed, an upper surface of the insulator 14 and the upper surface of the phase change body 12 may be further flattened, to enable the upper surface of the insulator 14 to be flush with the upper surface of phase change body 12 and have good flatness. In addition, the flatness of the second electrode 13 and the binding effect between the second electrode 13 and the phase change body 12 can also be effectively ensured.

In another implementation, the phase change memory may alternatively be manufactured through another technical process.

For example, as shown in FIG. 20, an embodiment of this application further provides another preparation method for a phase change memory, and the method may include the following steps:

Step S100: Prepare a first phase change layer on an upper surface of a first electrode.

Step S200: Etch the first phase change layer to form a first phase change sub-body.

Step S300: Prepare an insulator on the upper surface of the first electrode.

Step S400: Etch the insulator to form a through-hole that passes through to the first phase change sub-body.

Step S500: Prepare a second phase change sub-body in the through-hole.

Step S600: Prepare a second electrode on an upper surface of the second phase change sub-body.

As shown in FIG. 21, step S200 may specifically include the following steps:

Step S210: Arrange a first mask on an upper surface of the first phase change layer.

Step S220: Arrange a hollow-out pattern in the first mask.

Step S230: Etch the phase change layer exposed to the first mask to form a first phase change sub-body.

Step S400 may specifically include the following steps:

Step S410: Arrange a second mask on an upper surface of the insulator.

Step S420: Arrange a hollow-out pattern in the second mask.

Step S430: Etch the insulator exposed to the second mask to form a through-hole that passes through to the first phase change sub-body.

Figure 22:
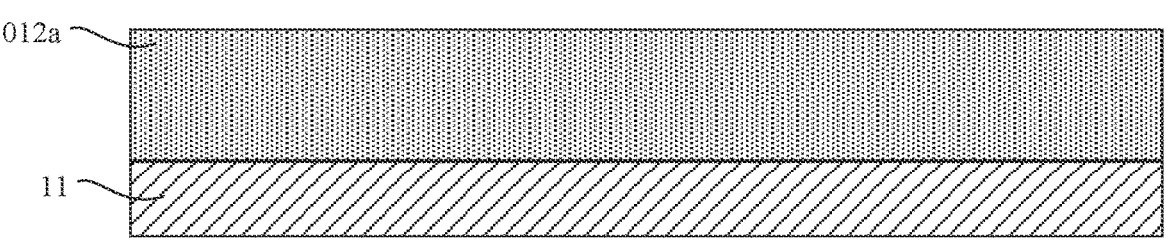
FIG. 22 is a structural diagram of a preparation process of a phase change memory according to an embodiment of this application.

For details, refer to FIG. 22. When step S100 is performed, a layer of phase change material with a specific thickness may be deposited on the upper surface of the first electrode 11, to form the first phase change layer 012*a*.

Figure 23:
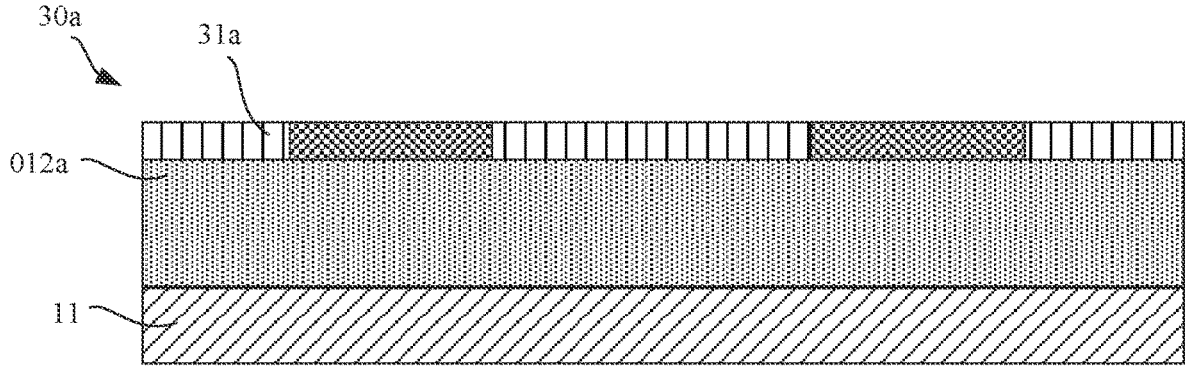
FIG. 23 is a structural diagram of another preparation process of a phase change memory according to an embodiment of this application.

Refer to FIG. 23. When step S210 and step S220 are performed, the first mask 30*a* may be placed on the upper surface of the first phase change layer 012*a*, and then the hollow-out pattern 31*a* is formed by performing etching in the mask through a process such as photoetching. The first mask 30*a* mainly blocks the first phase change layer 012*a*.

Figure 24:
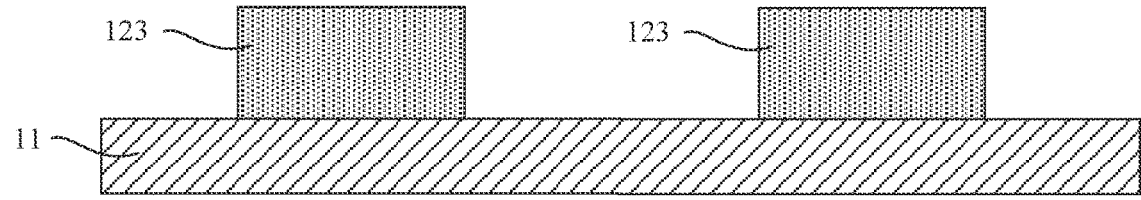
FIG. 24 is a structural diagram of another preparation process of a phase change memory according to an embodiment of this application.

Refer to FIG. 24. When step S230 is performed, a phase change material in a projection of the hollow-out pattern 31*a* in the first mask 30*a* may be removed from a part exposed to the first mask 30*a* through an etching process, to etch the first phase change layer 012*a* into a plurality of (two shown in the figure) independent first phase change sub-bodies 123.

It may be understood that, during preparation, a shape of the hollow-out pattern 31*a* may be properly set based on a required shape of the first phase change sub-body 123. In addition, an etching time may be properly regulated based on a required shape of the first phase change sub-body 123.

Figure 25:
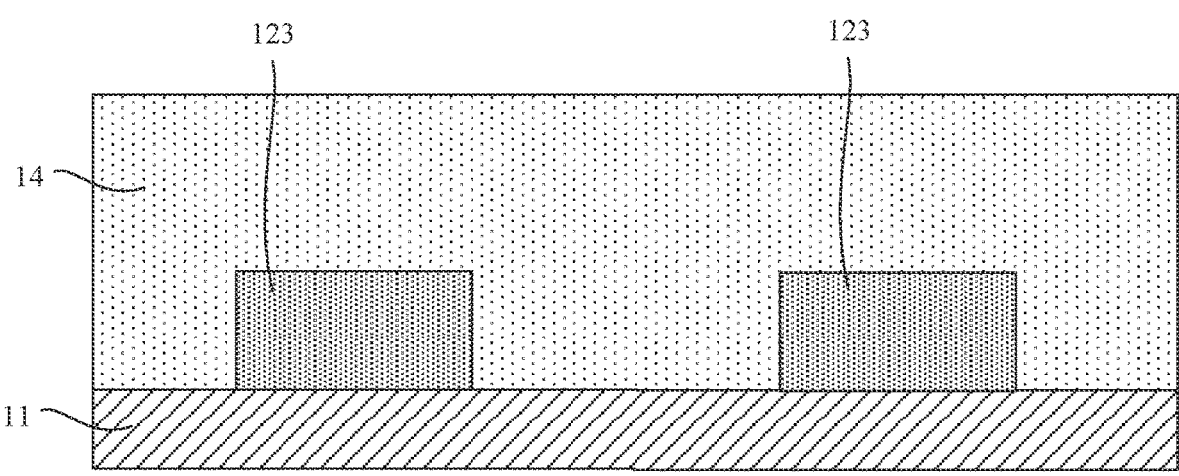
FIG. 25 is a structural diagram of another preparation process of a phase change memory according to an embodiment of this application.

Refer to FIG. 25. After the first phase change sub-body 123 is prepared and molded, step S300 may be performed to fill a gap between a plurality of first phase change sub-bodies 123 with an insulating material, so that the insulating material is wrapped around an outer circumferential surface and an upper surface of a first phase change body 12 to form the insulator 14. A thickness of the insulator 14 may be greater than a thickness of the first phase change sub-body 123.

Figure 26:
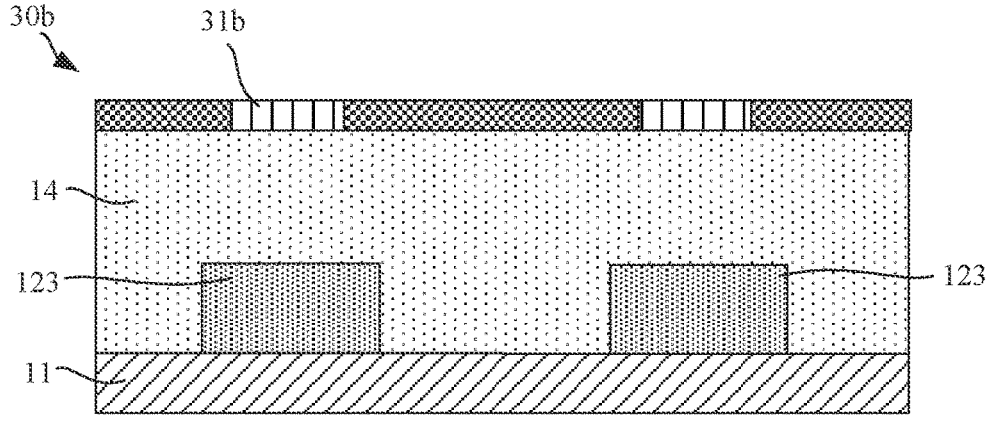
FIG. 26 is a structural diagram of another preparation process of a phase change memory according to an embodiment of this application.

Refer to FIG. 26. When step S410 and step S420 are performed, the second mask 30b may be placed on the upper surface of the insulator 14, and then the hollow-out pattern 31b is formed by performing etching in the second mask 30b through a process such as photoetching. The second mask 30b mainly blocks the insulator 14.

Figure 27:
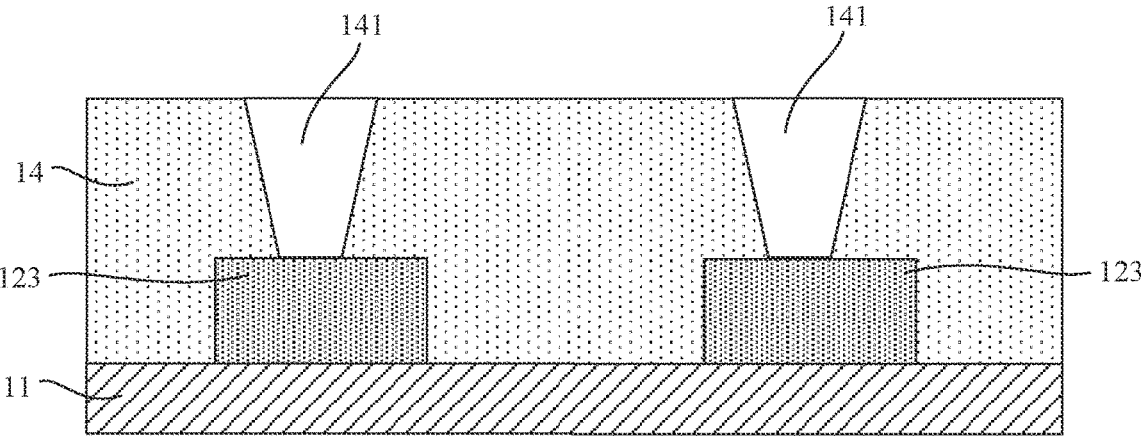
FIG. 27 is a structural diagram of another preparation process of a phase change memory according to an embodiment of this application.

Refer to FIG. 26 and FIG. 27. When step S430 is performed, an insulating material in a projection of the hollow-out pattern 31b in the second mask 30b may be removed from a part exposed to the second mask 30b through an etching process, to form, in the insulator 14, the through-hole 141 that passes through to an upper surface of the first phase change sub-body 123. During preparation, a shape of the hollow-out pattern may be properly set based on a required shape of the through-hole. In addition, an etching time may be properly regulated based on a required shape of the through-hole.

Figure 28:
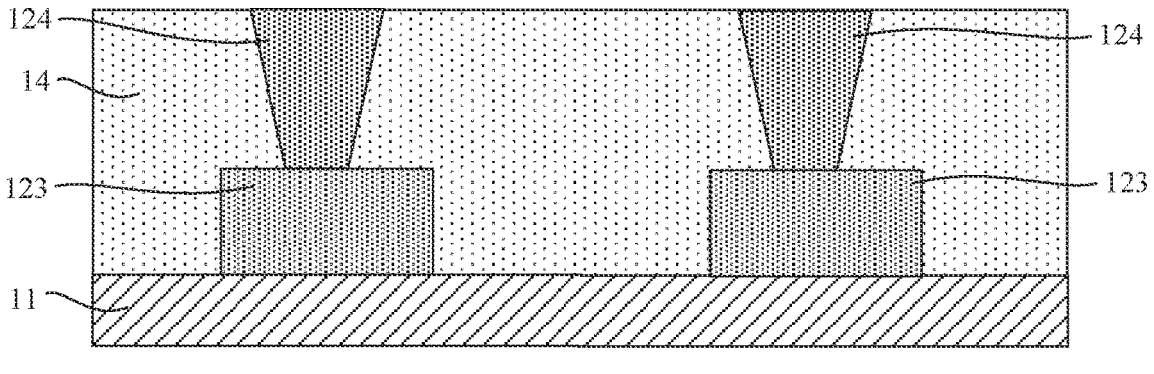
FIG. 28 is a structural diagram of another preparation process of a phase change memory according to an embodiment of this application.

Refer to FIG. 27 and FIG. 28. The through-hole 141 may be filled with a phase change material, to form the second phase change sub-body 124, and the second phase change sub-body 124 is effectively bound to the upper surface of the first phase change sub-body 123.

Figure 29:
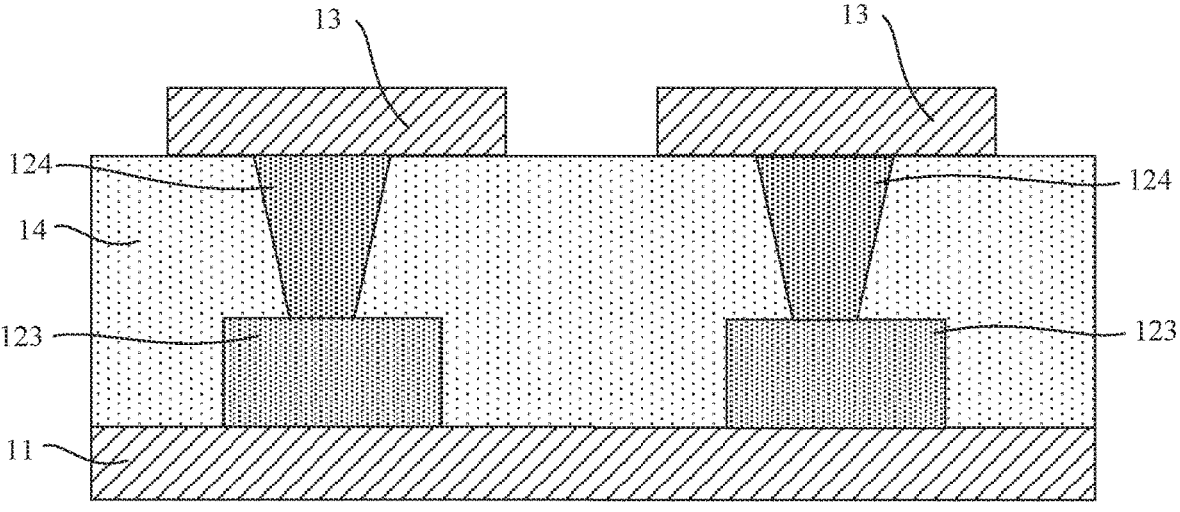
FIG. 29 is a structural diagram of another preparation process of a phase change memory according to an embodiment of this application.

Refer to FIG. 29. Finally, step S600 may be performed to prepare the second electrode 13 on the upper surface of the second phase change sub-body 124.

In addition, during specific implementation, to ensure flatness of the second electrode 13 and a binding effect between the second electrode 13 and the second phase change sub-body 124, before step S600 is performed, an upper surface of the insulator 14 and the upper surface of the second phase change sub-body 124 may be further flattened, to enable the upper surface of the insulator 14 to be flush with the upper surface of the second phase change sub-body 124. In addition, the flatness of the second electrode 13 and the binding effect between the second electrode 13 and the second phase change sub-body 124 can also be effectively ensured.

In addition, after the first phase change sub-body 123 is prepared and molded, the upper surface of the first phase change sub-body 123 may alternatively be flattened to ensure a molding effect of the insulator 14 and the second phase change sub-body 124. In addition, an effective binding between the first phase change sub-body 123 and the second phase change sub-body 124 can also be effectively ensured.

It may be understood that, when the phase change memory is prepared, another technical process may alternatively be used. This is not specifically limited in this application.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A phase change memory, comprising a plurality of phase change memory cells, wherein:

each of the plurality of phase change memory cells comprises a first electrode, a phase change body, and a second electrode;

the first electrode, the phase change body, and the second electrode are sequentially arranged in a first direction;

the phase change body has a first end face and a second end face, the first end face faces the first electrode, and the second end face faces the second electrode; and the phase change body further comprises a convergence portion, and the convergence portion is located between the first end face and the second end face, wherein a sectional area of the convergence portion in a direction perpendicular to the first direction is relatively smaller than an area of the first end face and an area of the second end face, and wherein the phase change body comprises a first phase change sub-body and a second phase change sub-body, an end face of the first phase change sub-body abuts against an end face of the second phase change sub-body and forms the convergence portion, and the sectional area of the convergence portion in the direction perpendicular to the first direction is relatively smaller than an area of the end face of the first phase change sub-body or an area of the end face of the second phase change sub-body.

2. The phase change memory according to claim 1, wherein the first end face is located at one end of the first phase change sub-body, and the second end face is located at one end of the second phase change sub-body.

3. The phase change memory according to claim 2, wherein the first phase change sub-body is in a shape of a cylinder, and the second phase change sub-body is in a shape of an inverted truncated cone.

4. The phase change memory according to claim 2, wherein the first phase change sub-body is in a shape of a truncated cone, and the second phase change sub-body is in a shape of a cylinder.

5. The phase change memory according to claim 1, wherein the convergence portion is at equal distances from the first end face and the second end face.

6. The phase change memory according to claim 1, wherein each phase change memory cell further comprises an insulator, the insulator is wrapped around an outer circumferential surface of the phase change body, and the outer circumferential surface of the phase change body is an outer surface, excluding the first end face and the second end face, of the phase change body.

7. The phase change memory according to claim 1, wherein the plurality of phase change memory cells are arranged in an array on a plane perpendicular to the first direction.

8. The phase change memory according to claim 1, wherein the plurality of phase change memory cells are stacked in the first direction.

9. An electronic device, comprising a controller and a phase change memory, wherein the phase change memory comprises a plurality of phase change memory cells, wherein:

each of the plurality of phase change memory cells comprises a first electrode, a phase change body, and a second electrode;

the first electrode, the phase change body, and the second electrode are sequentially arranged in a first direction;

the phase change body has a first end face and a second end face, the first end face faces the first electrode, and the second end face faces the second electrode; and the phase change body further comprises a convergence portion, and the convergence portion is located between the first end face and the second end face, wherein a sectional area of the convergence portion in a direction perpendicular to the first direction is relatively smaller than an area of the first end face and an area of the second end face, and wherein the phase change body comprises a first phase change sub-body and a second phase change sub-body, an end face of the first phase change sub-body abuts against an end face of the second phase change sub-body and forms the convergence portion, and the sectional area of the convergence portion in the direction perpendicular to the first direction is relatively smaller than an area of the end face of the first phase change sub-body or an area of the end face of the second phase change sub-body; and the controller is electrically connected to the first electrode and the second electrode.

10. The electronic device according to claim 9, wherein the first end face is located at one end of the first phase change sub-body, and the second end face is located at one end of the second phase change sub-body.

11. The electronic device according to claim 10, wherein the first phase change sub-body is in a shape of a cylinder, and the second phase change sub-body is in a shape of an inverted truncated cone.

12. The electronic device according to claim 10, wherein the first phase change sub-body is in a shape of a truncated cone, and the second phase change sub-body is in a shape of a cylinder.

13. The electronic device according to claim 10, wherein the plurality of phase change memory cells are stacked in the first direction.

14. The electronic device according to claim 9, wherein the convergence portion is at equal distances from the first end face and the second end face.

15. The electronic device according to claim 9, wherein each phase change memory cell further comprises an insulator, the insulator is wrapped around an outer circumferential surface of the phase change body, and the outer circumferential surface of the phase change body is an outer surface, excluding the first end face and the second end face, of the phase change body.

16. The electronic device according to claim 9, wherein the plurality of phase change memory cells are arranged in an array on a plane perpendicular to the first direction.

17. A preparation method for a phase change memory, comprising:

preparing a first phase change layer on an upper surface of a first electrode;

etching the first phase change layer to form a first phase change sub-body;

preparing an insulator on the upper surface of the first electrode, wherein a thickness of the insulator is greater than a thickness of the first phase change layer;

etching the insulator to form a through-hole that passes through to the first phase change sub-body;

preparing a second phase change sub-body in the through-hole; and preparing a second electrode on an upper surface of the second phase change sub-body.

18. The preparation method according to claim 17, wherein the etching the first phase change layer comprises:

arranging a first mask on an upper surface of the first phase change layer;

arranging a hollow-out pattern in the first mask, to enable a part of the upper surface of the first phase change layer to be exposed to the first mask; and etching the part of the upper surface of the first phase change layer exposed to the first mask.

19. The preparation method according to claim 17, wherein the etching the insulator comprises:

arranging a second mask on an upper surface of the insulator;

arranging a hollow-out pattern in the second mask, to enable a part of the upper surface of the insulator to be exposed to the second mask; and etching the part of the upper surface of the insulator exposed to the second mask.

20. The preparation method according to claim 17, wherein before the preparing a second electrode on an upper surface of the second phase change sub-body, the method further comprises:

flattening the upper surface of the insulator, to enable the upper surface of the insulator to be flush with the upper surface of the second phase change sub-body.

* * * * *